(12) United States Patent
Izawa et al.

(10) Patent No.: US 6,475,918 B1
(45) Date of Patent: Nov. 5, 2002

(54) PLASMA TREATMENT APPARATUS AND PLASMA TREATMENT METHOD

(75) Inventors: Masaru Izawa, Hino (JP); Kenetsu Yokogawa, Tsurugashima (JP); Nobuyuki Negishi, Kokubunji (JP); Yoshinori Momonoi, Kokubunji (JP); Shinichi Tachi, Sayama (JP)

(73) Assignee: Hitachi, Ltd., Tokyo (JP)

( * ) Notice: Subject to any disclaimer, the term of this patent is extended or adjusted under 35 U.S.C. 154(b) by 112 days.

(21) Appl. No.: 09/679,348

(22) Filed: Oct. 5, 2000

(30) Foreign Application Priority Data

Oct. 12, 1999 (JP) .......................................... 11-289148

(51) Int. Cl.⁷ .............................................. H01L 21/00
(52) U.S. Cl. ............. 438/714; 156/345.24; 156/345.26; 156/345.48; 216/60; 216/67; 216/79; 438/9; 438/723; 438/729; 438/732; 438/743
(58) Field of Search .................. 438/9, 14, 16, 438/712, 714, 723, 729, 732, 743; 216/67, 60, 79; 156/345 MT, 345 P, 345 C, 345 MG

(56) References Cited

U.S. PATENT DOCUMENTS 5,535,906 A * 7/1996 Drummond .................. 438/729
6,051,503 A * 4/2000 Bhardwaj et al. ............ 438/705

OTHER PUBLICATIONS

N. Ikegami et al, "Characteristics of Very High–Aspect–Ratio Contact Hole Etching", Japan Journal of Applied Physics, vol. 36, No. 4B, Part 1, Apr. 1997, pp. 2470–2476.

* cited by examiner

Primary Examiner—William A. Powell
(74) Attorney, Agent, or Firm—Mattingly, Stanger & Malur, P.C.

(57) ABSTRACT

An etching method capable of obtaining a fine fabricated shape, particularly, a vertical fabricated shape with less bowing upon fabrication of insulation films in the production of semiconductors, the method comprising controlling the incident amount of O, F or N radicals, gas flow rate or consumption amount of O, F and N on the inner wall surface with etching time to suppress excessive O, F and N which become excessive in the initial stage of etching, the method also including control for the flow rate or the consumption amount based on the result of measurement for plasmas during etching so as to obtain a stable etching shape. Since bowing can be reduced upon fabrication of insulation film hole and insulation film while maintaining the etching rate and the selectivity, finer semiconductor device can be produced easily.

21 Claims, 8 Drawing Sheets

PLASMA TREATMENT APPARATUS AND PLASMA TREATMENT METHOD

BACKGROUND OF THE INVENTION

This invention relates to a dry etching system and a dry etching method used for fine fabrication of semiconductor devices and, more in particular, it relates to a dry etching system and a dry etching method for attaining highly accurate dry etching fabrication for insulation films.

In a semiconductor device, for electrically connecting transistors formed on a wafer and metal wirings, as well as connection between metal wirings, contact holes are formed to a insulation film formed on a transistor structure and between wirings (thin film mainly composed of $SiO_2$, hereinafter referred to as an oxide film) and electric conductors are filled-in the contact holes. In the dry etching, etching gas is introduced into a vacuum chamber, a high frequency bias or $\mu$ wave is applied to the gas to generate plasmas, the oxide films are etched selectively by active species and ions formed in the plasmas to form contact holes. Upon etching, a resist thin film transferred with a hole pattern is formed on the oxide film.

In the contact hole fabrication, the oxide film has to be etched selectively to silicon forming a resist film, a wiring layer below the contact hole, or insulation film different from the etched film.

For the fabrication of the contact hole, etching is conducted by introducing fluoro carbon gas such as $CF_4$, $CHF_3$, $C_4F_8$, $C_4F_6$ or $C_5F_8$ and Ar gas into an etching device, conducting high frequency wave plasma discharge under a gas pressure condition of from 0.5 Pa to 10 Pa and under the condition of applying a Vpp voltage from 0.5 to 2.0 kV to the wafer. In a case where the thickness of the oxide film between the wiring layers is large and the aspect ratio of the contact hole (depth/diameter) is high, oxygen gas and CO gas are added for improving the hole penetration and addition of the CO gas has an effect of further enhancing the selectivity to the resist and the nitride film In recent years, Cu is used as a wiring material for higher speed operation of semiconductor devices, and use of organic insulation film and organic silicon oxide film as the insulation film between the wirings has been considered. Nitrogen-containing gas is used for the organic insulation film and gas substantially identical with that for the oxide film is used for an organic silicon oxide film.

A technique of forming contact holes at high aspect ratio to an oxide film using polycrystal Si as a mask is disclosed in Jpn. J. Appl. Phys. Vol. 36 (1997), pp 2470–2476.

However, in a case of fabricating contact holes at high aspect ratio in the existent etching systems, oxygen gas or CO gas has to be added in excess in order to avoid the problem that etching is interrupted failing to form an opening. Since CO constitutes a source for supplying oxygen radicals, etching has been conducted under oxygen radical rich condition. However, as the oxygen radicals become excessive, deposition films are not formed on the lateral side in the upper portion of the hole, and the hole fabricated shape is enlarged by the incidence of ions scattered by a mask. Extension of the hole occurs at a position somewhat deeper than the hole opening (upper portion) Referring more specifically, a hole diameter is enlarged compared with the hole opening and the hole-diameter is smaller as the hole depth is greater. That is, side etching occurs in the midway of the hole in the fabricated shape. Such a phenomenon that the hole diameter is enlarged is referred to as bowing.

When bowing should occur, gaps are formed when electroconductive materials such as polycrystal silicon or tungsten is filled in the hole to cause failure in semiconductor devices. Since the bowing becomes conspicuous as the hole aspect ratio is higher, it results in a bar for the size-reduction of semiconductor devices. Particularly, in the oxide film etching, bowing appears at an aspect ratio of 6 or more, and the bowing increases as the aspect ratio increases. The size of semiconductors has been reduced and fabrication at an aspect ratio of 10 or more is necessary but size reduction becomes difficult in view of trade off with the bowing shape.

The bowing phenomenon also occurs for the materials other than the oxide film and it becomes conspicuous, particularly, in organic insulation films. Depending on the condition, the bowing is conspicuous in the organic insulation films and organic silicon oxide films at an aspect ratio of about 2.5 or more. Since such thin films are used as insulation films between wirings, the aspect ratio is about from 5 to 10 in fine portions.

In order to prevent bowing, depositing gas is sometimes added but this results in a side effect such as lowering of the etching rate.

SUMMARY OF THE INVENTION

A problem to be solved by this invention is to suppress radicals causing bowing during etching, thereby reducing bowing to attain fine fabrication for insulation films.

In the case of etching for oxide films by $C_4F_8$ gas and CO gas, $CF_2$, F, O and C are formed mainly due to dissociation in plasmas (the term "radical" is sometimes attached at the head of names of atoms and molecules but this indicates same materials). In addition, while $CF_3$, CF, $C_2F_4$, $C_3F_7$ are also formed, explanations therefor are to be omitted since they have no influence in the aspect of this invention. The sticking coefficient of $CF_2$, F, O and C on the lateral surface of a hole is represented as: $S_C > S_F \approx S_O > S_{CF2}$ ($S_C$, $S_F$, $S_O$, $S_{CF2}$ represents respectively sticking coefficients for C, F, O and $CF_2$). For the sake of convenience, F or O is also represented by the sticking coefficient and the sticking coefficient corresponds to the etching probability for the deposition film. FIG. 1 is a schematic view for determining the dependence hole aspect ratio of the relative wall deposition in the mixed gas process of Ar, $C_4F_8$, $O_2$, CO using the foregoing relation of sticking coefficients. Depending on the relation of the sticking coefficients, C can be a protective film to a mask but, as shown in a curve 102, the reaching amount into the hole decreases abruptly as the aspect ratio of the hole becomes higher. On the other hand, as shown in a curve 103, it scarcely decreases even if the aspect ratio of the hole increases. On the contrary, since F and O react with depositing radicals C and $CF_2$ in the upper portion of the hole, the reaching amount to the vicinity of the bottom is decreased in a case of a hole at a high aspect ratio as shown by a curve 101.

For fabricating a hole at a high aspect ratio, it is necessary to supply a great amount of C and F radicals in order to suppress interruption of etching caused by excessive $CF_2$. Therefore, O and F radicals become excessive in a shallow portion of the hole and side wall deposition film with C and $CF_2$ is scarcely formed. Therefore, when ions scattered in the upper portion of the hole are entered to the lateral surface of the hole, $SiO_2$ film is etched (or sputtered) to bring about bowing. Assuming that the deposition film 2 formed of C and $CF_2$ is etched by F and O, a dimension shift for the fabricated shape occurs as shown by a curve 201 in FIG. 2. In this case, negative size shift means bowing. Bowing occurs at an aspect ratio of about 3.5.

In a case where holes are etched under the same condition (hereinafter referred to as uncontrolled etching), it is necessary to correspond the amount of F and O radicals to the hole at the highest aspect ratio. However, since the hole aspect ratio increases along with the progress of etching, an aspect ratio is about 3 for the diameter of 0.2 μm or less at the initial stage of etching even if the resist film thickness is considered. Since the resist film thickness is reduced as the size reduction of the devices progresses, the aspect ratio at the initial stage does not change so much depending on the generation of the semiconductor devices. As has been described above, since the aspect ratio at the initial stage is small, F and O are excessive at the initial stage of the etching in uncontrolled etching.

With the reasons described above, if the $O_2$ flow rate and the CO flow rate are increased along with etching time, bowing can be reduced. FIG. 2 shows a dimension shift of a fabricated shape by a curve 202 in a case of increasing the $O_2$ flow rate from 0 ml/min to 8 ml/min and the Co flow rate from 50 ml/min to 120 ml/min in proportion with time for the dimension shift of the fabricated shape. Bowing is remarkably reduced by decreasing excessive O as described above.

However, if the flow rate is merely changed with time, since response to the occurrence of interruption of etching and the flow rate is slow depending on the state of the system, the control method depends on the length of the pipeline and the type of the flow rate controller. As a means for coping with such problems, it is effective to adopt a method of monitoring the progress of oxide film etching and controlling the flow rate based on the monitored data, a method of using those with short response time such as application of bias to eliminate excessive F and C and, further, means for combining them. As a method of monitoring the progress of the etching, there can be mentioned emission spectrum of plasmas, optical film thickness gage, mass flow analyzer, laser induced optical spectrum and the like. Furthermore, in a case capable of controlling two or more electron temperatures regions, there is a means for controlling the dissociation of F by the control for the width of the electron temperature regions.

In the organic silicon film and the organic insulation film, bowing occurs due to excess O, F or Cl, as well as bowing also occurs due to excessive N radical. Accordingly, bowing can be reduced by controlling any of excessive radicals of O, F, Cl and N.

This invention provides an etching method of controlling the incident amount of O and F radicals along with lapse of etching time in an oxide film etching, thereby capable of suppressing bowing and obtaining a fabricated shape which is vertical and at high aspect ratio. In the etching of insulation films including organic materials, the invention provides an etching method capable of obtaining fabricated shape which is vertical and at a higher aspect ratio by adjusting the incident amount of N radicals.

DETAILED DESCRIPTION OF THE PREFERRED EMBODIMENTS

Example 1

Figure 3:
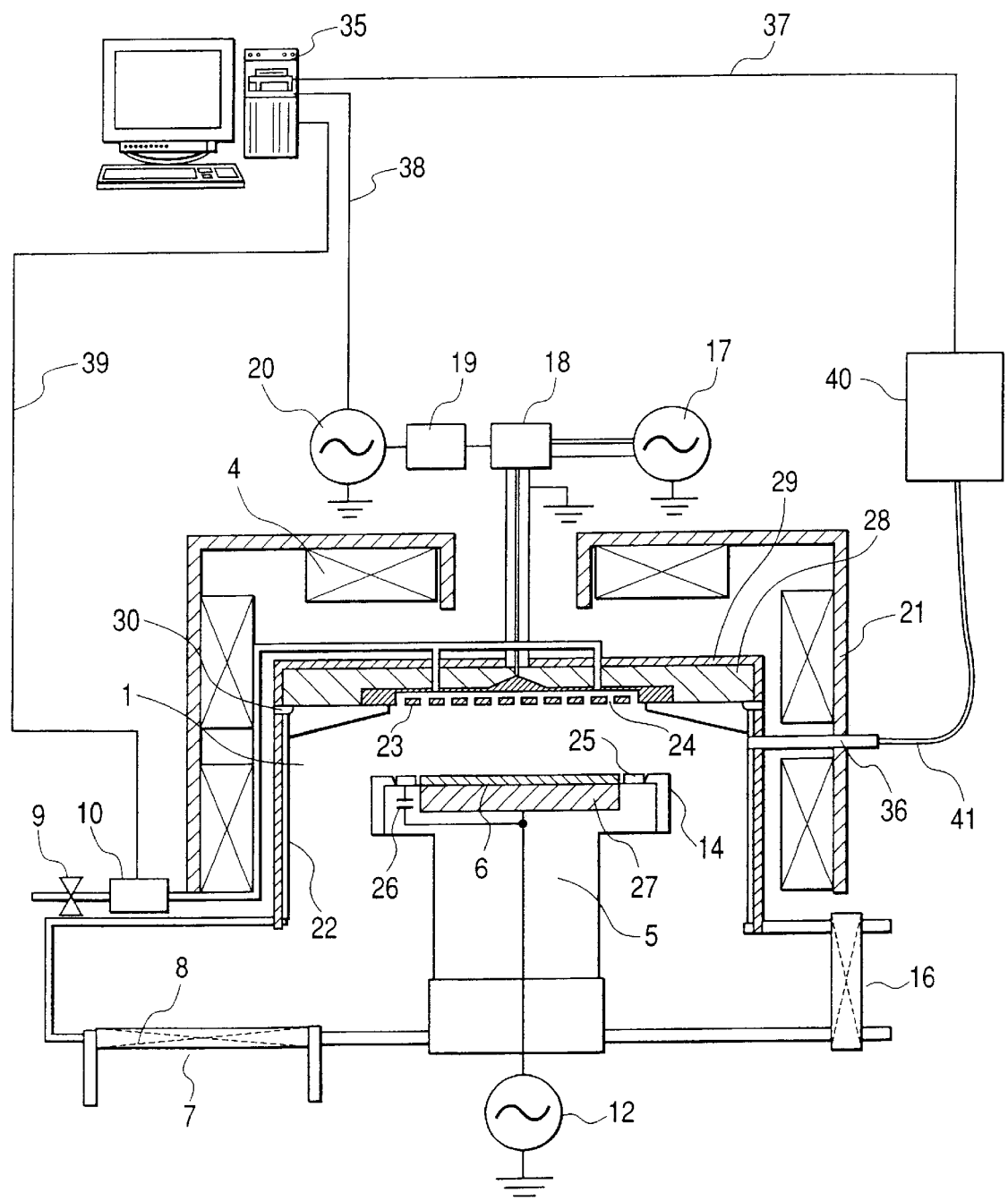
FIG. 3 is a view illustrating a cross section of a dry etching system used in this invention and connection with a computer.

An embodiment of this invention using a system shown in FIG. 3 is to be explained. The system has an antenna 23, an antenna dielectric substance 28 and a treating base 5 disposed in the inside of a plasma treatment system. Etching gas is introduced from gas introducing port 24 disposed to the antenna, and high frequency waves at 300 MHz to 900 MHz formed from a high frequency power supply 17 are introduced from the antenna 13 to a plasma treating chamber to generate gas plasmas. For efficiently transmitting high frequency waves to the plasma treating chamber, the outer diameter of the antenna and the material for the antenna dielectric substance 28 are determined such that high frequency waves cause resonance in a desired mode (TMO1 in this embodiment) between the antenna 23 and an antenna earth 29. High frequency waves cause resonance between the antenna and the antenna earth and transferred from the vicinity of the antenna dielectric substance to the plasma treating chamber. For attaining efficient discharge, solenoid coils 4 for generating magnetic fields are disposed by three at the periphery of the plasma treating chamber. Current for two coils is controlled such that magnetic fields from the 0 to 320 gauss are formed substantially just about the treating base and high density plasmas at an electron density of $10^{11}$ $N/cm^3$ or more are generated by utilizing electron cyclotron resonance (ECR). The plasma treating chamber 1 contains the treating base 5 on which an article 6 to be treated is placed and etched by the gas plasmas. Etching gas is introduced through a gas flow rate controller 10 into the plasma treating chamber 1 and exhausted by an exhaust pump 7 to the outside of the plasma treating chamber 1. The treating base 5 on which the article to be treated is placed has a high frequency power supply 12 and can apply high frequency bias at 400 KHz to 13.56 MHz. The treating base can be secured at a distance within a range of 20 mm to 150 mm from the antenna. A focus ring 25 of about 30 mm width (providing F-consuming effect at the periphery of the article to be treated when the width is 5 mm to 100 mm) can be installed at the periphery of wafers in the vicinity of the treating base 5 and high frequency waves applied to the wafer can be branched by about 10 to 20% of the component by a capacitor 26 and applied to the wafer. The focus ring has a two layered structure having a lower portion made of Al and an upper portion of crystalline Si. Impurity doped Si or SiC may also be used. A high frequency power supply 20 is connected to a filter circuit 19 so that a frequency (10 KHz to 27 MHz) different from that of the high frequency power supply 17 can be applied to antenna 23. The antenna is made of impurity doped Si on the side of the plasma treating chamber and made of Al on the opposite side.

Figure 4:
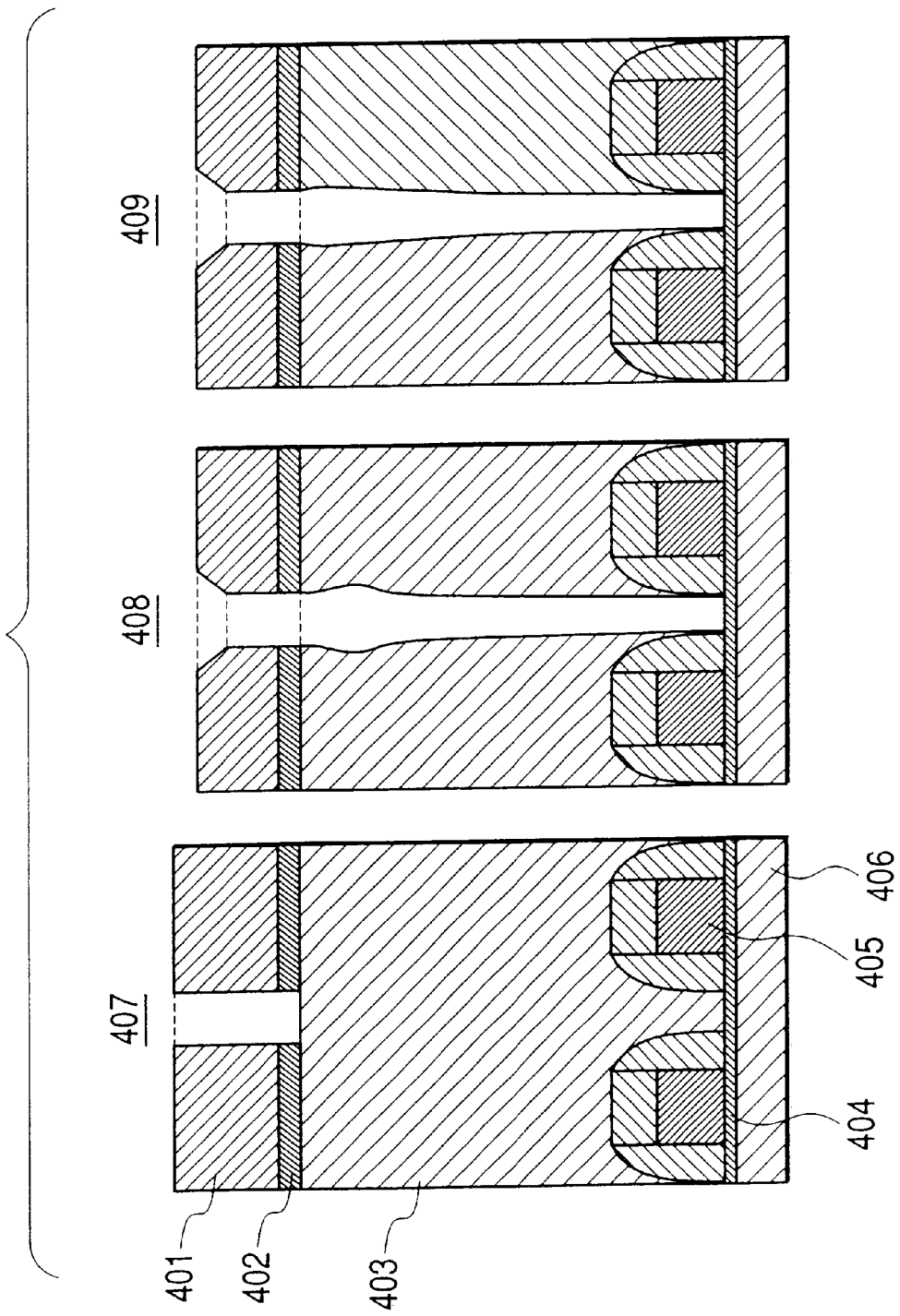
FIG. 4 is a cross sectional view for the shape of an oxide layer hole on the article to be treated used in this invention before and after fabrication.

An eight inch (diameter) silicon wafer having a structure shown in FIG. 4 is conveyed as the article to be treated into the system. A silicon wafer 406 has a gate oxide film 405 of 4 nm thickness formed thereon and a gate electrode 404 of 200 nm thickness and 100 nm width made of polycrystal Si and W formed to a portion thereon. An oxide film 403 (SOG and CVD oxide film) of 2000 nm thickness (at the most thick part) on the gate electrode and the gate oxide film. Further, an anti-reflection film 402 of 80 nm thickness and a resist mask 401 of 500 nm thickness to which a hole pattern of 120 nm diameter is developed by exposure are formed on the oxide film. The width of the oxide film between the gate electrodes is about 160 nm. The anti-reflection film is already etched by $N_2$ and $CH_4$ mixed gas plasmas.

Ar at 1250 ml/min, $C_5F_8$ at 24 ml/min and $O_2$ at 30 ml/min are introduced in the system from the gas introduction port to the plasma treating chamber to increase the gas pressure to 2.5 Pa. The oxide film is etched by forming gas plasmas by 1.8 kW high frequency waves at 450 MHz and applying a 2000 W bias voltage at 800 KHz to the treating base. The height of the treating base is adjusted such that the distance (gap) from the surface of the wafer to the antenna 23 as the wafer opposed face is 50 mm, and the coil current is controlled such that the magnetic field magnitude at the position of 35 mm just above the wafer center and at the position of 40 mm just above the wafer periphery is 160 gauss and the gradient of magnetic field at the positions is 8 gauss/cm. A high frequency 200 W bias at 13.56 MHz is applied to the antenna.

Under the conditions described above, the etching rate for the oxide film of 120 nm diameter hole is about 700 nm/min and the selectivity to the resist is about 8. Etching reaches Si at the bottom in about 170 sec, and etching is applied for about 220 sec in total to ensure the contact. In this case, a fabricated shape 408 is as shown in FIG. 4 and bowing occurs in the upper portion of the hole by the excess of oxygen. The $O_2$ flow rate depends on the aspect ratio of the hole to be fabricated and $O_2$ flow rate has to be increase by 60% and by about 120% at the aspect ratio of 20 till the end of etching relative to the initial flow rate at an aspect ratio of 10.

For reducing the bowing, the $O_2$ flow rate is controlled to 15 ml/min at the start of etching and the $O_2$ flow rate is increased each by 0.8 ml/min on every ten second rate of etching, and controlled constant after the flow rate reaches 30 ml/min. When etching is applied under the condition, since excess oxygen is decreased in the initial stage of etching, a protective film is formed to greatly suppress the bowing and wafer is etched as shown by fabrication shape 409 in FIG. 4. Since the quantity of entered radicals in total during etching is also decreased, the amount of residual film of the resist mask is also increased by about 30%.

Figure 1:
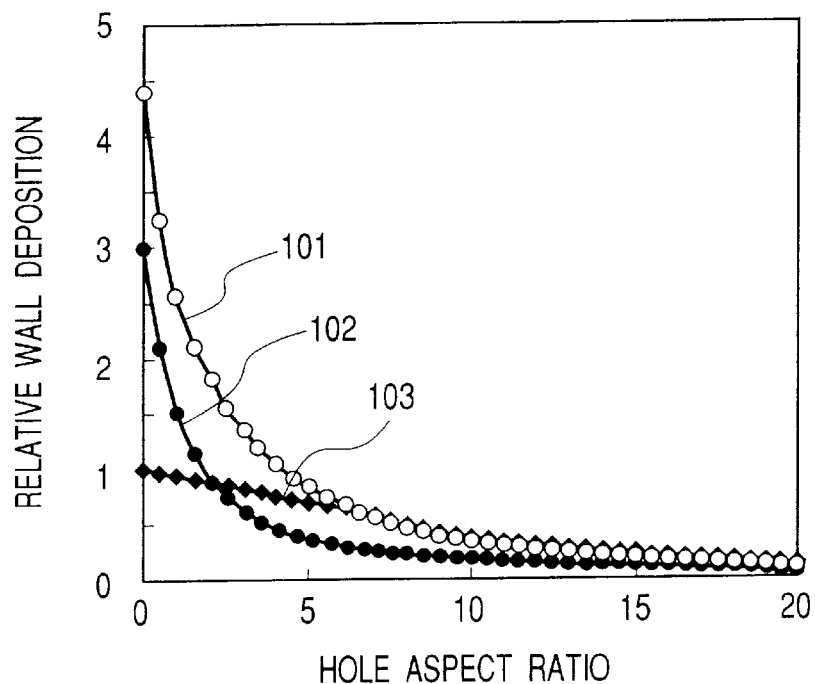
FIG. 1 is a conceptional view illustrating the dependence of the amount of radicals to be deposited or reacted on the lateral side of a hole on the hole aspect ratio.
Figure 2:
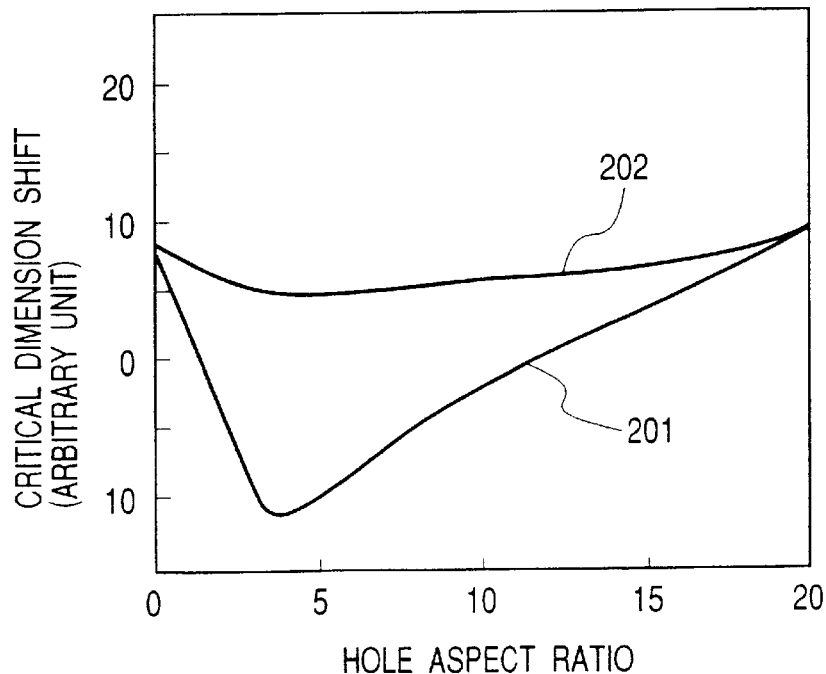
FIG. 2 is a curve showing dependence of the dimension shift used in this invention on the hole/aspect ratio.

Since the $O_2$ flow rate control described above provides an $O_2$ flow rates just before interruption of etching, there may be a worry for the stability of the process. In order to ensure the stability of the process more, the $O_2$ flow rate is controlled while measuring emission spectrum. An emission spectralizer 40 is connected through an optical fiber 41 to a window 36 disposed in a vacuum treating chamber in the system shown in FIG. 1, and the spectralizer 40 and a computer 35 for the control are connected by way of a data line 37. The emission spectralizer monitors emission of $CF_2$ (about 280 nm) as an etchant of the oxide film and a reaction product SiF (about 440 nm). When interruption of etching occurs, $CF_2$ increase and SiF decreases. Lowering of the etching rate can be seen by the decrease of $SiF/CF_2$ intensity ratio of optical emission lines in order to improve the accuracy. At a specific etching area of about 5%, the intensity ratio of optical emission line changes by about 10% depending on the existence of etching. Fabrication shape with less bowing can be obtained stably with no problem of etching interruption even when the state of the system changes somewhat by increasing the $O_2$ flow rate in accordance with the change of the intensity ratio of optical emission line. The state of the system mentioned herein means the thickness of deposits on the wall surface in the vacuum treating chamber, the state after long time use and delicate differences between the system.

In the system shown in FIG. 3, a gas flow controller 10 is connected to the computer 35 and a $O_2$ flow rate is controlled based on the intensity ratio of optical emission line. The etching conditions are as described above, in which the $O_2$ initial flow rate is 15 mi/min and the maximum $O_2$ flow rate is 30 ml/min.

The $O_2$ flow rate is controlled by the computer regarding the etching condition such that the $O_2$ flow rate is increased by 1 ml/min when the $SiF/CF_2$ intensity ratio of optical emission line is decreased by 0.5% in about one sec. The $O_2$ flow rate increases gradually to the maximum 30 ml/min. Under this control, an etching fabrication shape with less bowing can be obtained irrespective of the state of the system. The amount of residual film of the resist mask is also increased.

The emission spectrum can be controlled in the same manner also by using $CF_2$ and SiF at other wavelength. Further, emission intensity can be controlled in accordance with change of $C_2$. Furthermore, in a case of using organic silicon oxide, it may be controlled based on the change of the emission intensity of CO or O.

As a method of reducing the incident amount of O radicals, means for disposing a mechanism for consuming O radicals may be disposed in the system. In the system shown in FIG. 3, when an impurity doped SiC is used for the material of the antenna 23, C and O are reacted by the application of the antenna bias to consume O. Accordingly, the incident amount of O can be controlled by adjusting the antenna bias. Particularly, the consuming effect at the antenna is larger as the distance between the wafer and the antenna is shorter. Distance between the wafer and the surface of the antenna 130 mm or more is not preferred since, the reaction products at the antenna are dissociated again to form O.

Etching is conducted under the same conditions as described above except for the antenna bias power, using the same gas as described above at a flow rate of 1250 ml/min for Ar, 24 ml/min for $C_5F_8$ and 25 ml/min for $O_2$ flow rate. The antenna bias power is set to 800 W upon start of etching. Since the etching amount of the antenna SiC is in proportion with the antenna bias power, the consumption amount of O is also substantially in proportion therewith. The antenna bias is decreased from 800 W to 100 W by 40 W each on every ten seconds. By the control for the antenna bias, an excessive amount of O radicals is suppressed and bowing occurs scarcely. The amount of residual film of the resist mask also increases.

When the antenna bias is controlled a similar result can be obtained in the same manner as by the central depending on the change of $CF_2/SiF$ intensity ratio of optical emission line, and stable fabrication shape can be obtained, by connecting the power supply and the computer.

A similar result can be obtained also by using F-containing gas such as $CF_4$, $C_2F_6$, $SiF_4$, $SF_6$, $CF_3OF$, $CF_2(OF)_2$ or $CF_3I$ instead of $O_2$ as gas for ensuring the penetration (prevention for interruption of etching). For ensuring penetrating by F radicals, a similar result can also be obtained by using Si instead of SiC for the antenna. In addition, a similar effect can also be obtained by using CO gas. When the ensuring penetration is ensured with addition of $N_2$ gas, an antenna of C or SiC may be used.

When excessive F and O are eliminated by the antenna, C or organic conductive material as the antenna material can also provide a similar effect. An insulator may also be used for the antenna material so long as the thickness is at the such a level capable of applying bias and a similar effect can be obtained also with an organic material such as polyimide plate or polyethyl imide plate of about 2 to 6 mm thickness and with an SiC plate of less impurity.

Similar result can be obtained by using, as the etching gas, not only $C_5F_8$ but also $CHF_3$, $C_2F_4$, $C_3F_6$, $C_4F_6$, $C_4F_8$, $C_5F_6$, $C_6F_6$, $C_2F_4H_2$, $C_2F_5H$, $C_3F_6H_2$ or $C_3F_7H$. The dilution gas is not restricted only to Ar but He, Ne, Kr or Xe gas may also be used.

As a method of controlling the amount of F produced, since F is selectively formed in a portion at a low electron temperature other than the ECR region of plasmas, similar effect can also be obtained by controlling the gradient of magnetic field in the ECR region and controlling the amount of F radicals. Since the extension of the CR region is in inverse proportion with the gradient of magnetic field, the gradient of magnetic field is controlled such that it is smaller in the initial etching stage and increased along with the progress of etching.

Since the incident amount of ions decreases as the gradient of magnetic field increases, a high frequency wave power for forming the plasmas has to be increased simultaneously.

Specifically, when the frequency of high frequency wave (UHF) is at 450 MHz, the gradient of magnetic field may be increased from 4 G/cm to 20 G/cm with lapse of time at the position where the magnetic field magnitude at an upper portion at the center of the wafer is 160 G and, simultaneously, UHF power may be increased from 1.6 kW to 2.0 kW. Alternatively, the gradient of magnetic field may also be controlled by emission spectrum.

The same effect as described above can be obtained also by adjusting the distance between the wafer and the wafer opposing face (antenna).

A similar effect can also be obtained in a case where the film to be etched is an organic silicon oxide film.

Example 2

Figure 5:
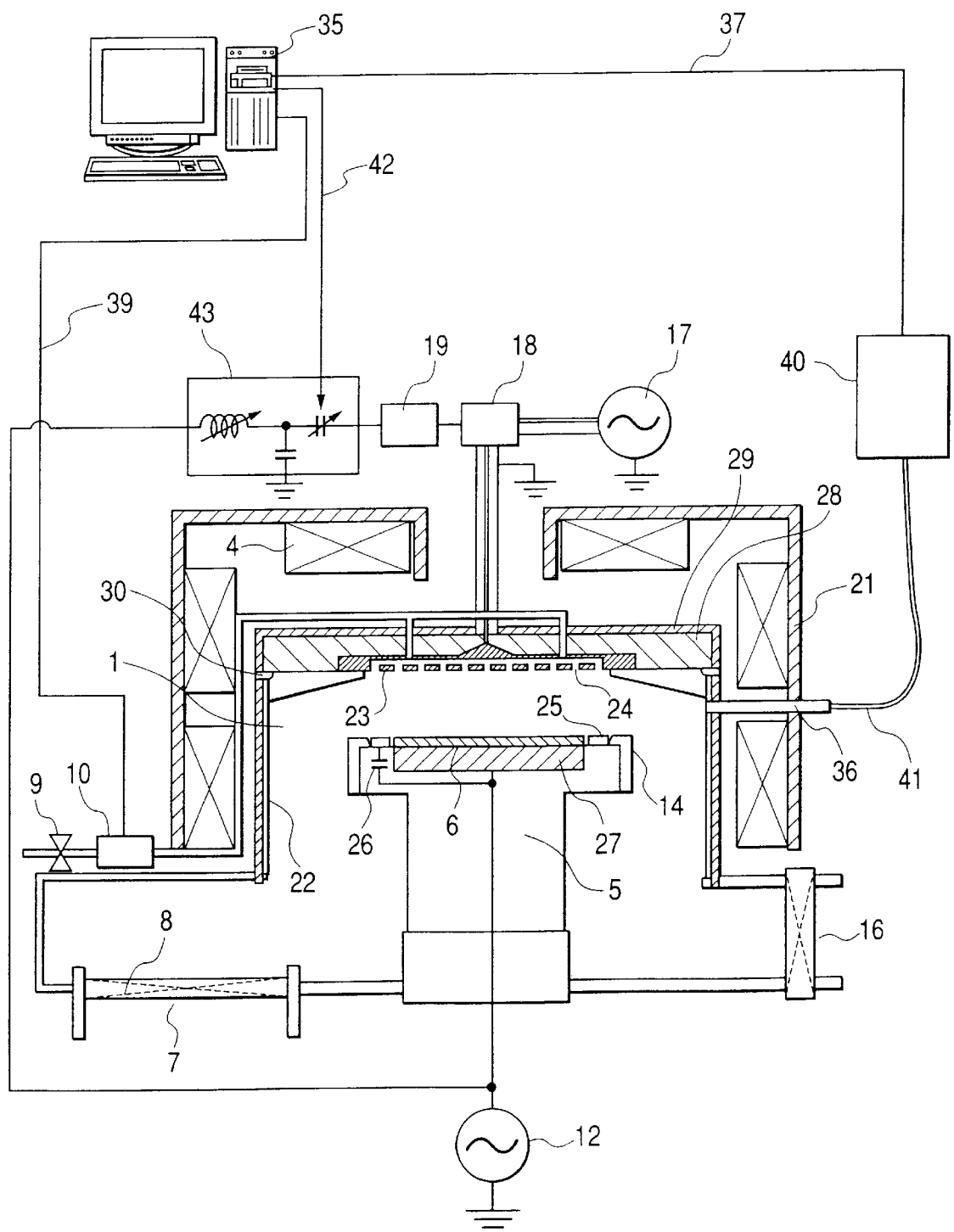
FIG. 5 is a view illustrating a cross section of another dry etching system used in this invention and connection with a computer.

Another embodiment using a system shown in FIG. 5 is to be explained. This system has a structure that a power from a high frequency power supply 12 of a lower electrode is divided by a power distributor 43 in the system shown in FIG. 3 and applying bias is applied under adjustment of phase to the antenna.

Figure 6:
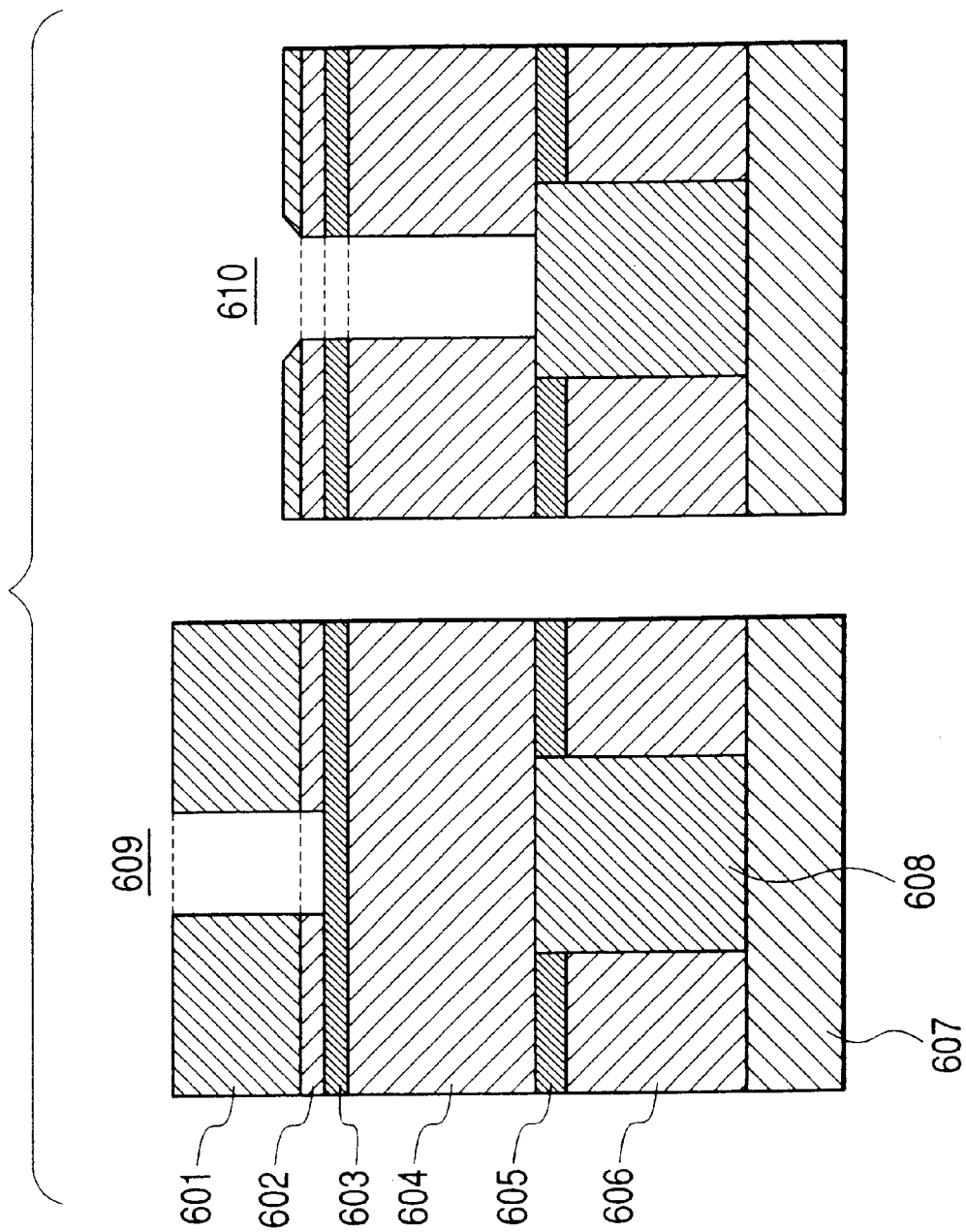
FIG. 6 is a cross sectional view for the shape of an organic layer hole on the article to be treated used in this invention before and after fabrication.

An eight inch silicon wafer of a structure shown in FIG. 6 is conveyed as an article to be treated into the system. Although not illustrated in the drawing, a silicon wafer has a transistor structure thereon which is covered at the upper part thereof with an oxide layer 607. A Cu wiring 608 is formed on the oxide film 607 and the periphery thereof is covered with anoxide film 605 and an organic insulation film 606. An organic insulation film 604 of 500 nm thickness and an oxide film 603 of 50 nm thickness are formed on the Cu wiring and the organic insulation film is bonded at upper and lower portions with insulative adhesives. Further, an anti-reflection film 602 of 80 nm thickness and a resist mask 601 of 600 nm thickness formed with a hole pattern of 150 nm diameter by development and exposure are formed further thereon. The anti-reflection film is already etched by $N_2$ and $O_2$ mixed gas plasmas.

In the system, the oxide film is etched by introducing Ar at 500 ml/min, $C_4F_8$ at 20 ml/min and $O_2$ at 10 ml/min through the gas introduction port into a plasma treating chamber to increase a gas pressure to 2.0 Pa. Then, for etching the organic insulation film, $NH_3$ gas is introduced at 100 ml/min to increase the gas pressure to 3 Pa and 1.0 kW power at a power source frequency of 450 MHz is introduced from the antenna to form gas plasmas. The capacitor and the coil of a distributor 43 are adjusted such that 100 W high frequency bias at 800 KHz is applied to the antenna. The height of the treating base is adjusted such that the distance (gap) from the surface of the wafer to the antenna 23 as the wafer opposed face is 70 mm, and the coil current is controlled such that the magnetic field magnitude at the position of 35 mm just above the wafer center and at the position of 50 mm just above the wafer periphery is 160 gauss and the gradient of magnetic field at the positions is 12 gauss/cm. A high frequency 300 W bias at 400 KHz is applied to the antenna.

Under the conditions described above, the etching rate for the oxide film of 150 nm diameter hole is about 500 nm/min and the selectivity to the resist is about 1.3. Etching reaches Cu at the bottom in about 60 sec, and etching is applied for about 80 sec in total to ensure the contact. In this case, in the fabricated shape bowing occurs in the upper portion of the hole by the excess of N.

Since H has an effect of reacting with N on the lateral side to remove N, $H_2$ is added at 24 ml/min at the initial stage of etching and then decreased each by 4 ml/min on every ten seconds. Etching treatment is applied by gas plasmas of introduced N. It is effective to add from 5% to 50% $H_2$ at the initial stage of etching relative to the amount of introduced N. The excessive N is decreased at the initial stage of etching to obtain a fabricated shape with less bowing as shown in a fabricated shape 610 in FIG. 6. Use of $CH_4$, $C_2H_6$, $CH_3OH$ instead of $H_2$ provides a similar effect and, since such additive gas is burnable, a similar effect can also be obtained when diluting with rare gas such as Ar. While $NH_3$ has been used as the etching gas, a substantially the same effect can be obtained also with mixed gas of $N_2$ and $H_2$ with the adjustment of $H_2$ flow rate. When $N_2$ and $O_2$ are used as the etching gas, since the reactivity O is high, a similar effect can also be obtained by controlling the $O_2$ flow rate.

When C or SiC is used as the antenna material, fabricated shape with less bowing can be obtained by adjusting the antenna bias with suppression of excessive N or excessive O in the same manner as in the case of the oxide film etching.

In a case of controlling the antenna bias or the gas flow rate depending on emission spectrum, since the CN emission intensity is related with the etching rate, the flow rate such as of $H_2$ or $CH_4$ may be decreased along with reduction of the CN emission intensity. In the case of $O_2$ flow rate, if it is increased along with reduction of the CN emission intensity, bowing can be suppressed.

While the foregoing procedures have been applied to the hole fabrication of the organic insulation film, bowing can be reduced also in the fabrication of a groove pattern.

Example 3

Figure 7:
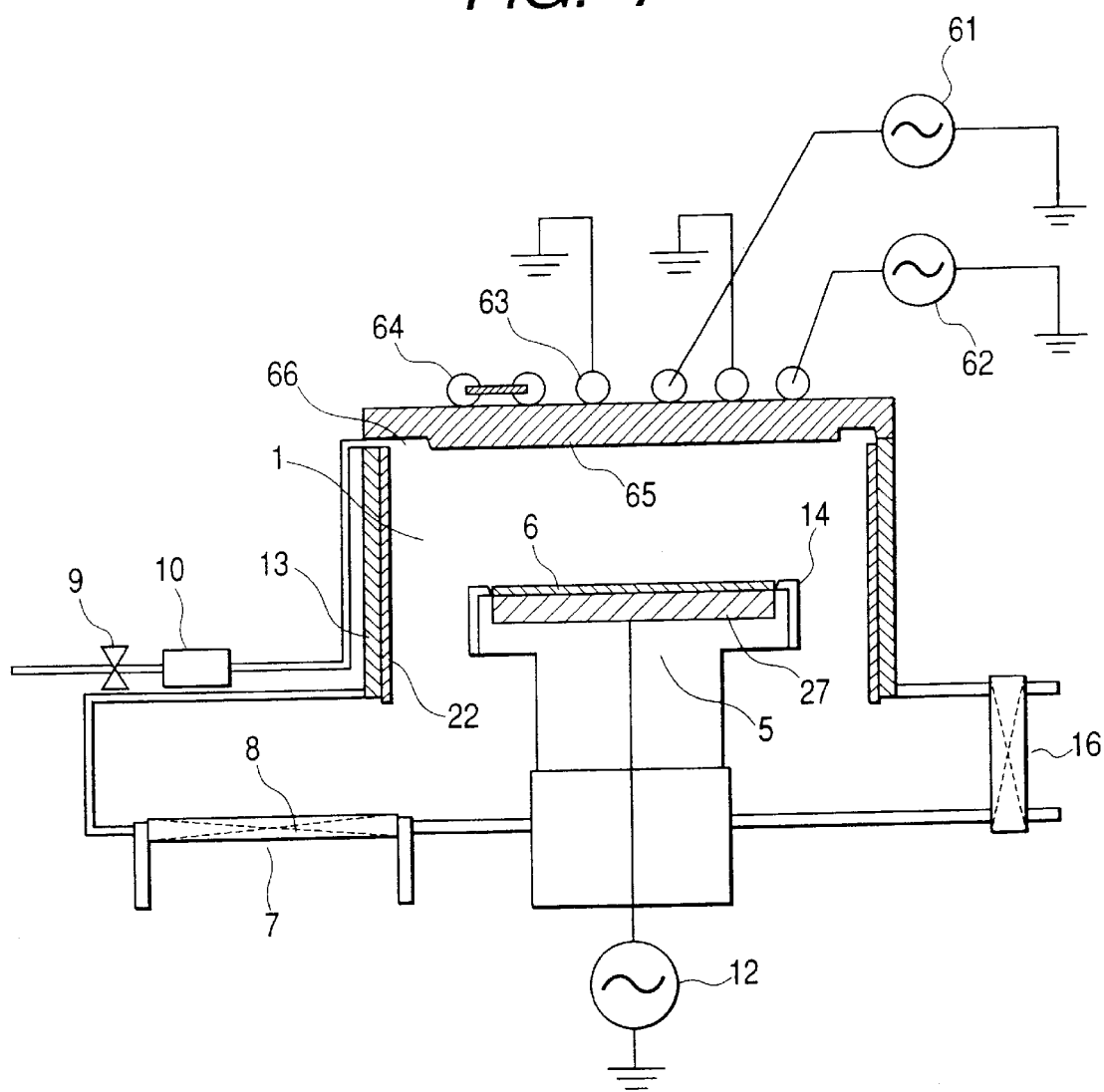
FIG. 7 is a cross sectional view of another dry etching system used in this invention.

A further embodiment of the invention using an system shown in FIG. 7 is to be explained. In this system, etching gas is introduced from a gas introducing port 66 into a plasma treating chamber 1, high frequency waves from 0.5 to 15 MHz are generated from a first high frequency power supply 61 and a second high frequency power supply 62, and the high frequency waves are introduced from ring antennas (or loop antennas) 63, 64 passing through a ceramic material 65 respectively into the plasma treating chamber 1 to generate gas plasmas. The plasmas are high density plasmas having electron density of $10^{11}$ N/cm$^3$ or more. The plasma treating chamber 1 has a treating base 5 on which an article 6 to be treated is placed and etched by gas plasma. The etching gas is introduced through a gas flow rate control device to the plasma treating chamber 1 and then exhausted by an exhaustion pump 7 out of the plasma treating chamber 1. A high frequency power supply 12 is disposed to a treating base 5 on which an article to be treated is placed and a high frequency bias from 400 KHz to 13.56 MHz can be applied. Wafer opposing face is formed of ceramic material 65 comprising impurity containing Si and SiC by about 30% and about 70% respectively and is grounded to the earth. An elevating mechanism is disposed to the treating base 5 such that the distance between the wafer and the inner surface of the ceramic material can be adjusted to 20 mm to 150 mm.

An eight inch silicon wafer as an article to be treated is conveyed into the system. An oxide film of 2 $\mu$m thickness is formed on the silicon wafer, over which a resist mask transferred to the mask pattern is formed. A resist mask is formed with a hole of 150 nm diameter.

In the system, etching gas is introduced as Ar at 50 ml/min, $C_3F_8$ at 20 ml/min and $Si(OCH_3)_2F_2$ at 4 ml/min from a gas introducing port to the treating chamber to increase gas pressure to 0.7 Pa and the treating base is adjusted such that the distance from the wafer to the inner wall surface of the ceramic material is 70 mm. High frequency waves of 1000 W at 1.8 MHz are applied to a first ring antenna 63 and 700 W high frequency waves at 2.2 MHz are applied to a second ring antenna 64 to generate glass plasmas. A 1200 W bias at 2 MHz is applied to the treating base to etch the oxide film. Under this condition, bowing occurs through the etching rate is 600 nm/min.

For reducing excessive F, etching is conducted while lowering the $Si(OCH_3)_2F_2$ flow rate from 14 ml/min to 4 ml/min. The change of the flow rate is set to 1 ml/min on every 20 sec. Since excessive F is removed with Si and $CH_3$, bowing is reduced greatly.

As the gas species there can be used, in addition to $Si(OCH_3)_2F_2$, $Si(CH_3)_2F_2$, $Si(CH_3)_2Cl_2$, $Si(OCH_3)_2Cl_2$, $Si(CH_3)_3H$, $Si(CH_3)_2H_2$, $SiH_4$, $Si_2H_6$ or $SiCl_2H_2$.

As the etching gas, not only $C_3F_8$ but also $CHF_3$, $C_2F_4$, $C_3F_6$, $C_4F_6$, $C_4F_8$, $C_5F_6$, $C_5F_8$, $C_6F_6$, $C_2F_4H_3$, $C_2F_5H$, $C_3F_6H_2$ or $C_3F_7H$ may be used and a similar effect can be obtained also in a case of adding $O_2$ in order to ensure hole penetration. The dilution gas is not restricted only to Ar but He, Ne, Kr or Xe gas may also be used.

The flow rate can be controlled also by emission spectrum by connecting a measuring equipment for emission spectrum and a mass controller in the same manner as shown in FIG. 3.

As etching gas, bowing can also be reduced by the same controller as in Example 1 by using gas used in Example 1.

Figure 8:
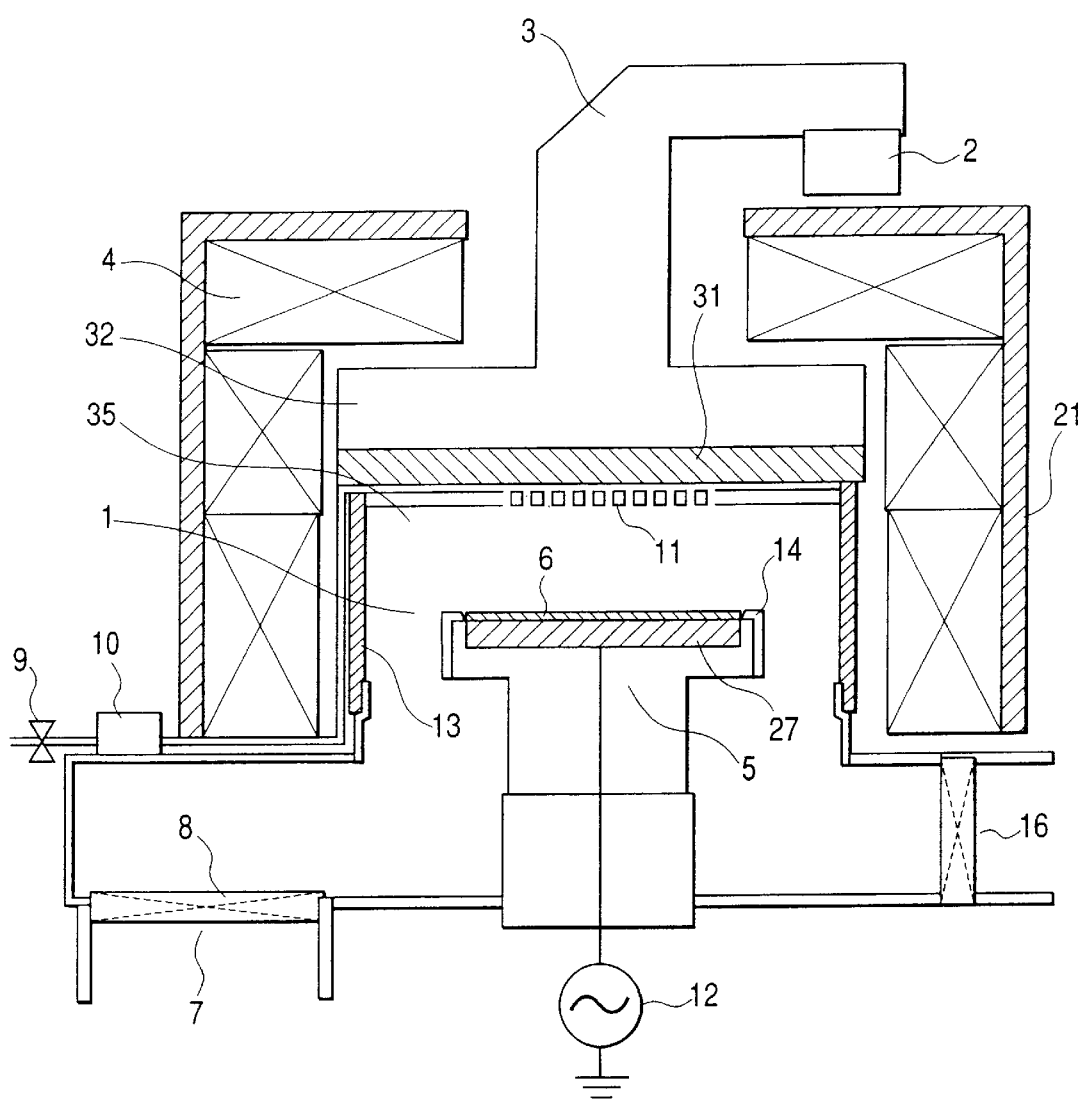
FIG. 8 is a cross sectional view of the other dry etching system used in this invention.
Figure 9:
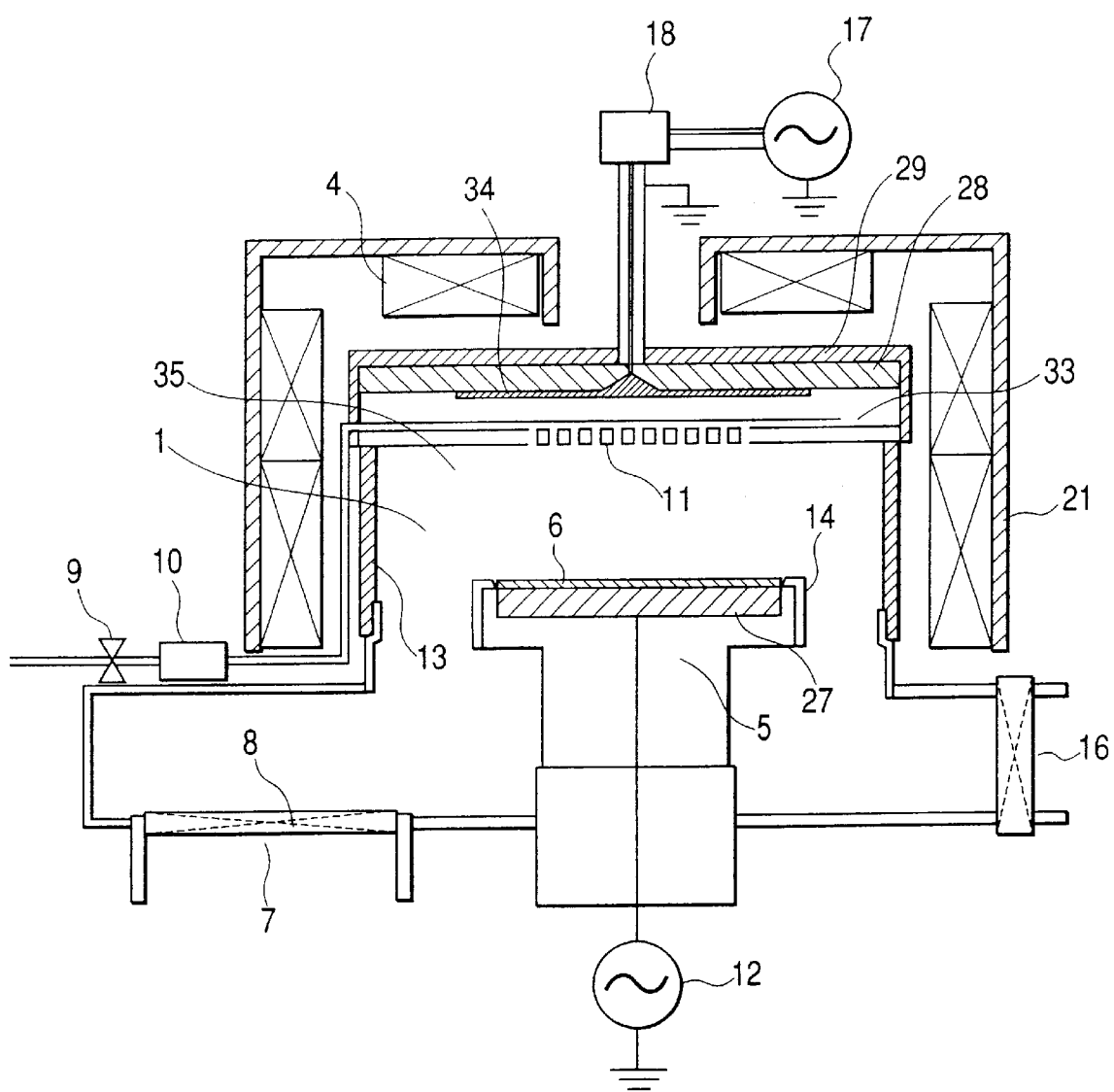
FIG. 9 is a cross sectional view of the other dry etching system used in this invention.

In addition to the system used in Examples, the same effect can also be obtained by using an etching system having a cavity resonator shown in FIG. 7, an etching device of an aerial antenna shown in FIG. 8 and a parallel plate type system. Since the system shown in FIG. 7 or FIG. 8 has no electrode such as an antenna to a portion in contact with the plasmas, a similar effect with that of the antenna can be obtained by disposing a Si plate, SiC plate or C plate in the plasma treating chamber and applying a high frequency bias thereto.

According to this invention, since the incident amount of F and O radicals during etching is properly controlled, bowing is suppressed while maintaining the etching rate and the selectivity, so that high vertical fabrication shape can be obtained in etching of contact hole at high aspect ratio and etching for thin film containing organic materials.

According to this invention, since vertical property is improved in the fine hole fabrication and groove fabrication for insulation film of a semiconductor device, the device failure is reduced.

What is claimed is:

1. A plasma treating system, comprising:
    a treating chamber maintained in a vacuum state by a vacuum pump,
    gas introduction equipment in the treating chamber, for introducing gas into the treating chamber,
    plasma generating equipment which converts the introduced gas into a plasma in the treating chamber,
    a support for an article to be treated in the treating chamber, such that the article are in a state in contact with or free from contact with the plasma treating the article to be treated,
    wherein the amount of radicals in the plasma is changed with treating time.

2. A plasma treating system according to claim 1, further comprising:
    an electrode or an antenna disposed for introducing first high frequency waves into the treating chamber, and
    equipment for applying second high frequency waves to the electrode or antenna,
    wherein the power of the second high frequency waves is changed with the treating time, thereby changing the amount of radicals in the plasma.

3. A plasma treating system according to claim 1, wherein the gas flow rate is changed with treating time, thereby changing the amount of radicals in the plasma.

4. A plasma treating system according to claim 1, further comprising equipment for measuring the state of the article to be treated or radicals in the plasma,
    wherein the amount of radicals is changed in synchronization with the equipment for measurement.

5. A plasma treating system according to claims 1 to 4, wherein the radicals to be changed are O, F or N.

6. A plasma treating system according to claims 1 to 5, wherein an insulation film formed on the article to be treated is etched.

7. A plasma treating system according to claim 6,
    wherein the insulation film formed on the article to be treated is an oxide film, and the equipment for measuring the plasma is an emission measuring instrument to measure the intensity ratio of an optical emission line for $SiF/CF_2$.

8. A plasma treating system according to claim 6,
    wherein the insulation film formed on the article to be treated is an organic film, and the equipment for measuring the plasma is an emission measuring instrument to measure the emission intensity of CN.

9. A plasma treating system according to claims 1 to 8, wherein the electrode or the antenna applied with the second high frequency waves includes Si or C.

10. A plasma treating system according to claim 1, wherein the first high frequency waves are at a frequency of 300 MHz to 900 MHz, and the first high frequency waves are introduced by using a plate antenna disposed in the vacuum treating chamber, the plasma treating system further comprising:

solenoid coils disposed at the periphery of the treating chamber, arranged to apply magnetic fields to form the plasma by electron cyclotron resonance, wherein the distance between the plate antenna and the surface of the article to be treated is from 20 mm to 150 mm.

11. A plasma treating method, comprising the steps of;

introducing first high frequency waves to a plasma treating chamber, growing a plasma in the treating chamber by the introduced first high frequency waves, plasma treating an article to be treated, and controlling the amount of dissociated radicals in the plasma with treating time.

12. A plasma treating method according to claim 11, wherein the amount of radicals in the plasma is changed by applying a power of second high frequency waves to an electrode or an antenna disposed for the introduction of the first high frequency waves while changing the power of the second high frequency waves with treating time.

13. A plasma treating method according to claim 11, wherein the amount of radicals in the plasma is changed by changing a gas flow rate of treating gas with treating time.

14. A plasma treating method according to claim 11, wherein the amount of radicals is changed in synchronization with equipment for measuring the state of the article to be treated or radicals in the plasma.

15. A plasma treating method according to claims 11 to 14, wherein the radicals to be changed are O, or F or N.

16. A plasma treating method according to any one of claims 11 to 15, wherein an insulation film formed on an article to be treated is etched.

17. A plasma treating method according to claim 16, wherein the insulation film formed on the article to be treated is an oxide film, and the amount of radicals is changed in synchronization with the intensity ratio of an optical emission line of $SiF/CF_2$ in the plasma.

18. A plasma treating system according to claim 16, wherein the insulation film formed on the article to be treated is an organic film, and the amount of radicals is changed in synchronization with the intensity of an optical emission line of CN in the plasma.

19. A plasma treating method according to claim 12, wherein the electrode or the antenna applied with the second high frequency waves is a material including Si or C.

20. A dry etching system comprising:

a plasma treating chamber for maintaining a plasma atmosphere;

a workpiece support member adapted for supporting the workpiece to be processed at a position within said plasma treating chamber;

a gas introducing port located in said plasma treating chamber;

a gas flow controller for controlling a process gas, connected to said gas introducing port;

an emission spectralizer for monitoring optical emission of an etchant and a reaction product in said plasma atmosphere; and a computer electrically connected to said emission spectralizer and said gas flow controller; wherein said gas flow controller is controlled by said computer on the basis of an intensity ratio of optical emission measured by said emission spectralizer.

21. A dry etching system as claimed in claim 20, wherein said emission spectralizer is connected through an optical fiber to a window disposed in said plasma treating chamber.

* * * * *